(12) United States Patent
Choi

(10) Patent No.: US 9,058,074 B2
(45) Date of Patent: Jun. 16, 2015

(54) ORGANIC LIGHT EMITTING DISPLAY

(71) Applicant: LG Display Co., Ltd., Seoul (KR)

(72) Inventor: Ho-Won Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 60 days.

(21) Appl. No.: 13/710,924

(22) Filed: Dec. 11, 2012

(65) Prior Publication Data

US 2014/0078077 A1    Mar. 20, 2014

(30) Foreign Application Priority Data

Sep. 18, 2012  (KR) ................. 10-2012-0103189

(51) Int. Cl.
*G06F 3/041* (2006.01)
*G06F 3/044* (2006.01)
*H01L 27/32* (2006.01)

(52) U.S. Cl.
CPC .............. *G06F 3/041* (2013.01); *H01L 27/323* (2013.01); *G06F 3/0412* (2013.01); *G06F 3/0416* (2013.01); *G06F 3/044* (2013.01)

(58) Field of Classification Search
CPC ....... G06F 3/041; G06F 3/044; G06F 3/0412; G06F 2203/04103; H01L 27/323
USPC ................................. 345/173, 174
See application file for complete search history.

(56) References Cited

U.S. PATENT DOCUMENTS 5,949,502 A * 9/1999 Matsunaga et al. ............. 349/40
8,872,168 B2 * 10/2014 Choi et al. ...................... 257/40

| | | | |
|---|---|---|---|
| 2005/0248713 A1* | 11/2005 | Hirosue et al. ............. | 349/158 |
| 2009/0315856 A1* | 12/2009 | Oikawa et al. ............. | 345/174 |
| 2011/0043465 A1 | 2/2011 | Huang et al. | |
| 2011/0291987 A1* | 12/2011 | Wang et al. ................ | 345/174 |
| 2012/0062481 A1 | 3/2012 | Kim et al. | |
| 2012/0105344 A1* | 5/2012 | Ko et al. .................... | 345/173 |
| 2012/0181923 A1 | 7/2012 | Cho et al. | |
| 2012/0299888 A1* | 11/2012 | Kim et al. .................. | 345/205 |
| 2013/0077005 A1* | 3/2013 | Kim et al. .................... | 349/40 |
| 2014/0042398 A1* | 2/2014 | Choi et al. ................... | 257/40 |
| 2014/0062909 A1* | 3/2014 | Choi et al. .................. | 345/173 |

FOREIGN PATENT DOCUMENTS

| | | | |
|---|---|---|---|
| EP | 2159842 A2 | 3/2010 | |
| EP | 2447812 A2 | 5/2012 | |
| JP | 2005-235467 A | 9/2005 | |
| JP | 2010282171 A | 12/2010 | |
| KR | 10-2012-0045292 A | 5/2012 | |
| TW | 201205384 A | 2/2012 | |

OTHER PUBLICATIONS

GB Office Action issued Mar. 25, 2013.
Japanese Office Action issued Feb. 4, 2014.
Korean Office Action issued in Korean Patent Application No. 10-2012-0103189 on May 29, 2014.
Taiwanese Office Action issued in Taiwan Patent Application No. 101149191 on Feb. 17, 2015.

* cited by examiner

*Primary Examiner* — Allison Johnson
*Assistant Examiner* — Afroza Chowdhury
(74) *Attorney, Agent, or Firm* — Morgan, Lewis & Bockius LLP

(57) ABSTRACT

Disclosed is an organic light emitting display an organic light emitting display that can efficiently prevent permeation of moisture in a structure including an in-cell touch electrode array, the uppermost layer of the second buffer layer contacting the sealant between the dead region adjacent to the touch pad portion and the touch pads is an inorganic film.

13 Claims, 13 Drawing Sheets

ORGANIC LIGHT EMITTING DISPLAY

This application claims the benefit of Korean Patent Application No. 10-2012-0103189, filed on Sep. 18, 2012, which is hereby incorporated by reference as if fully set forth herein.

BACKGROUND OF THE INVENTION

1. Field of the Invention

The present invention relates to an organic light emitting display, and more particularly, to an organic light emitting display that can efficiently prevent permeation of moisture in a structure including an in-cell touch electrode array.

2. Discussion of the Related Art

Examples of flat panel displays include liquid crystal displays (LCDs), organic light emitting displays (OLEDs), plasma display panels (PDPs), quantum dot panels (PDPs), field emission displays (FEDs), electrophoretic displays (EPDs) and the like. These displays include a flat display panel realizing an image in common as an essential component. Such a flat display panel has a configuration in which a pair of transparent insulating substrates are joined together such that they face each other via a layer containing an inherently luminescent or polarizing material or other optical material interposed therebetween.

In accordance with the recent trend toward large-size displays, demand for flat panel displays taking a smaller space gradually increases. Of these flat panel displays, organic light emitting display technologies are being rapidly developed.

Organic light emitting displays do not require any separate light source and include an organic light emitting diode that spontaneously emits light in each pixel, to realize display. The organic light emitting displays attract much attention as next-generation displays since they advantageously do not require light sources as well as structures for assembling the light sources with a display panel, thus having advantages of decrease in thickness and weight.

When electric charges are injected into an organic film formed between an electron injection electrode (cathode) and a hole injection electrode (anode), electrons pair with holes and the pairs then decay. At this time, an organic light emitting diode emits light.

Meanwhile, there is increasing demand for addition, to an organic light emitting display, of a touchscreen in which a site touched by the hand or separate input element is sensed and information is transferred in response thereto. Such a touchscreen is being applied by adhesion to the outer surface of the display.

Depending on touch sense method, a touchscreen is divided into resistive, capacitive and infrared sensing types. In consideration of ease of manufacture, sensing force and the like, capacitive type touchscreens attract much attention in small models.

Hereinafter, a touchscreen-integrated organic light emitting display of related art will be described with reference to the annexed drawings.

FIG. 1 is a sectional view illustrating a touchscreen organic light emitting display of related art.

As shown in FIG. 1, the touchscreen-integrated organic light emitting display of related art includes an organic light emitting display panel 1, a touchscreen 2 and a cover window 3 laminated in this order from the bottom and includes first and second adhesive layers 15 and 25 disposed between the respect layers.

Here, the organic light emitting display panel 1 includes a substrate, a thin film transistor array having a matrix form disposed on the substrate, and an organic light emitting diode connected to each thin film transistor of the thin film transistor array, and includes a protective film and a polarizing layer that cover the top of the organic light emitting diode. In this case, the first adhesive layer 15 corresponds to the polarizing layer of the organic light emitting display panel 1. Also, the second adhesive layer 25 is formed between the touchscreen 2 and the cover window 3 to adhere the touchscreen 2 to the cover window 3.

The touchscreen-integrated organic light emitting display of related art has the following disadvantages.

First, in a case in which an organic light emitting display panel and a touchscreen are independently formed and the touchscreen is then attached to the organic light emitting display panel, the organic light emitting display panel and the touchscreen require separate glasses, thus causing increase in hardness and thickness, which makes realization of thin and flexible organic light emitting displays impossible.

Second, the organic light emitting display panel and the touchscreen have different panel shapes, thus making processes for forming these components complicated and thus decreasing yield and price competitiveness.

Third, a polarizing plate is provided in order to prevent recognition of exterior light of the organic light emitting display panel. The polarizing plate has a thickness of about 150 μm or more, is expensive and causes a deterioration in transmittance. Accordingly, since the polarizing plate deteriorates flexibility when used for displays and is expensive, other alternative capable of preventing deterioration in visibility is required.

SUMMARY OF THE INVENTION

Accordingly, the present invention is directed to an organic light emitting display that substantially obviates one or more problems due to limitations and disadvantages of the related art.

An object of the present invention is to provide an organic light emitting display that can efficiently prevent permeation of moisture in a structure including an in-cell touch electrode array.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, provided is an organic light emitting display including a transistor-organic light emitting diode array and a touch electrode array, on a first buffer layer and a second buffer layer, respectively, having an active region and a dead region and facing each other, the organic light emitting display including: a touch pad portion formed in a part of the dead region of the second buffer layer; a plurality of touch pads spaced from one another in the touch pad portion; a dummy pad portion formed in the dead region of the first buffer layer, the dummy pad portion including a plurality of dummy pads corresponding to the touch pads, respectively; and a sealant including a plurality of conductive balls between the touch pad portion and the dummy pad portion, wherein the uppermost layer of the second buffer layer contacting the sealant between the dead region adjacent to the touch pad portion and the touch pads is an inorganic film.

Each touch pad may include a metal layer formed on the second buffer layer, a transparent conductive pattern and an interlayer insulating film interposed between the metal layer and the transparent conductive pattern to bring the metal layer into contact with the transparent conductive pattern.

The uppermost layer of the second buffer layer contacting the edge of the sealant may be SiNx or SiOx.

The uppermost layer of the second buffer layer contacting the edge of the sealant may be a transparent conductive film.

The transparent conductive film may be directly formed on the second buffer layer.

The uppermost layer of the second buffer layer contacting the edge of the sealant may be the second buffer layer.

The interlayer insulating film may include at least one of SiNx, SiOx and polyimide.

A sidewall of the interlayer insulating film of the touch pad may be covered with SiNx or SiOx.

The interlayer insulating film of the touch pad may be an organic insulating film.

The transparent conductive pattern of the touch pad may be the same layer as the transparent conductive film.

The transparent conductive pattern may be spaced and separated between the touch pads.

The transparent conductive pattern may include a double-layer transparent conductive film material.

A first layer of the double-layer transparent conductive film material may be the same as the first and second electrodes that constitute the touch electrode array and cross each other and a second layer thereof may be the same as the common electrode pattern that covers the first and second electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting display and a method for manufacturing the same will be described in detail with reference to the annexed drawings.

In recent years, there is increasing demand for touch sensing as well as thinness and flexibleness of organic light emitting displays. In response to this, a method in which a thin film transistor and an organic light emitting array are formed on a first substrate, a touch electrode array is formed on a second substrate, these substrates are joined together, and the hard and thick first and second substrates are removed by laser irradiation or etching in order to realize thin film and flexibility is suggested. In this case, a pad portion of the touch electrode array faces a pad portion of the organic light emitting array, and these pad portions are connected to each other via a conductive ball, thus enabling transfer of signals to the touch electrode array and detection of signals from the touch electrode array.

Hereinafter, an in-cell organic light emitting display in which a touch electrode array is provided inside a cover glass will be described.

Figure 1:
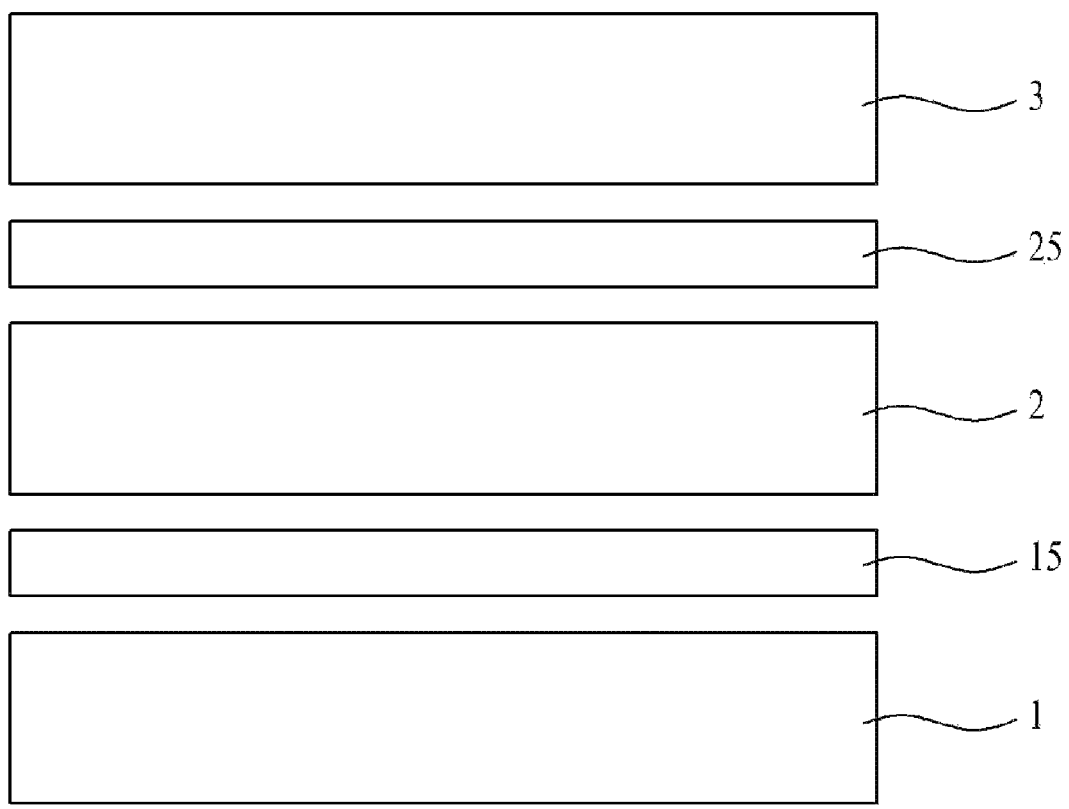
FIG. 1 is a sectional view illustrating a touchscreen organic light emitting display of related art.
Figure 2:
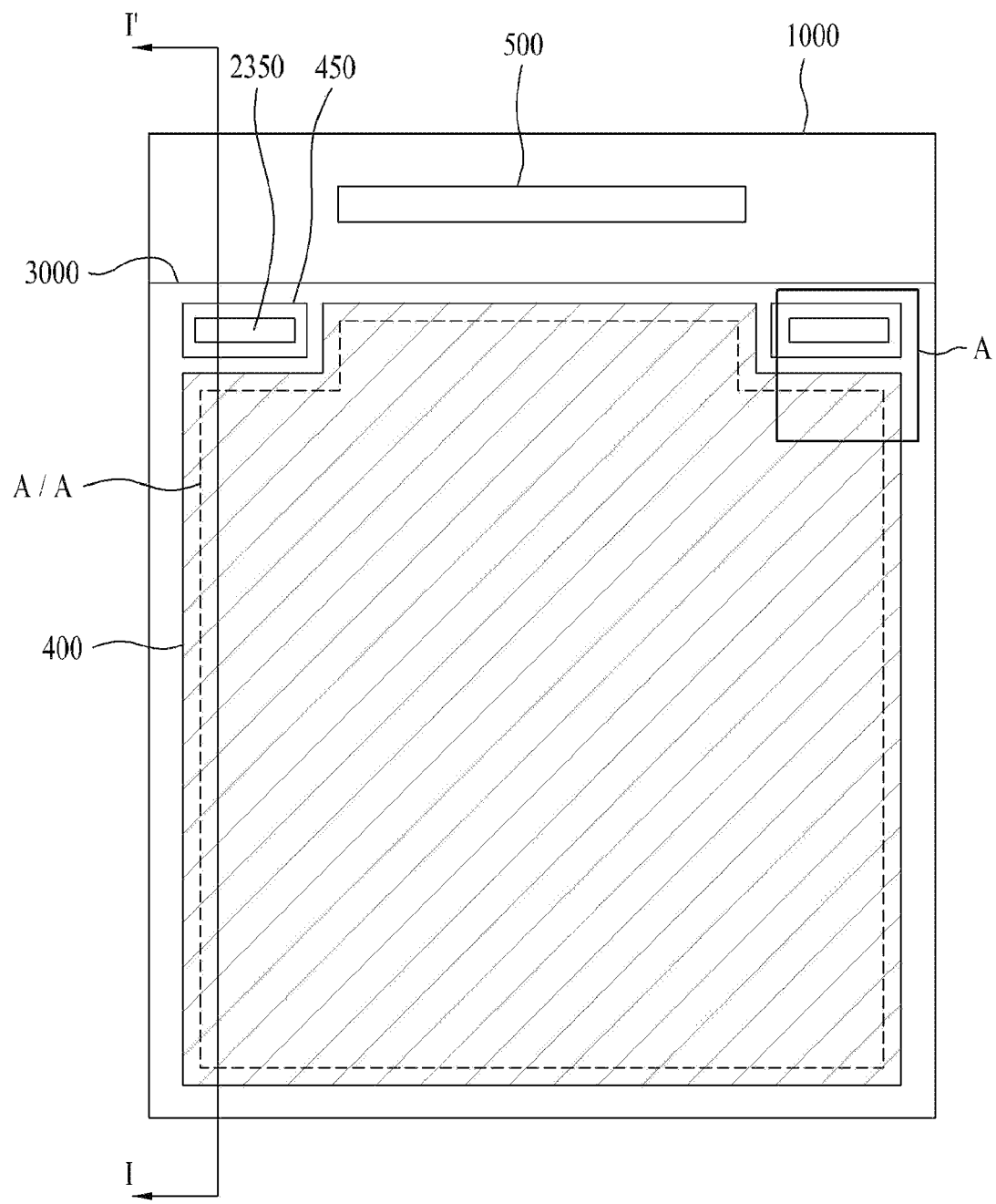
FIG. 2 is a plan view illustrating an organic light emitting display according to the present invention.
Figure 3:
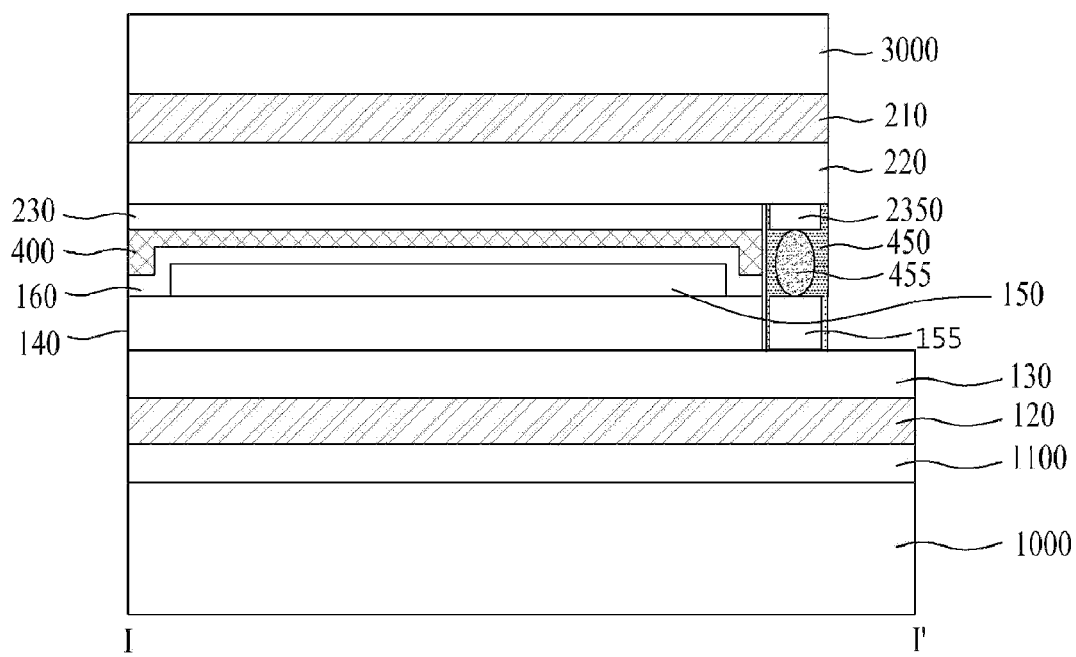
FIG. 3 is a sectional view taken along the line I-I' of FIG. 2.

FIG. 2 is a plan view illustrating an organic light emitting display according to the present invention. FIG. 3 is a sectional view taken along the line I-I' of FIG. 2.

As shown in FIG. 2 and FIG. 3, the organic light emitting display according to the present invention has a configuration in which an organic light emitting array 150 and a touch electrode array 230, that are formed at an inside of a film substrate 1000 and at an inside of a cover glass 3000, respectively, and have different sizes, are joined to each other via an adhesive layer 400.

Also, according to the organic light emitting display of the present invention, these arrays are not directly formed on the film substrate 1000 or the cover glass 3000 and are obtained by separately preparing first and second substrates (both, not shown), each being made of glass, joining the substrates via an adhesive layer disposed between the organic light emitting array 150 and the touch electrode array 230 (that is, this joining process is performed while keeping the first and second substrates), and removing the first and second substrates by laser irradiation or etching for realization of thin film and flexibility. In this case, as shown in FIG. 2, the first and second substrates formed of glass materials are removed and the film substrate 1000 and the cover glass 3000 are adhered to the bottom of the exposed arrays, respectively, in order to protect these arrays.

Here, a film adhesive layer 1100, a first anti-etching layer 120, a first buffer layer 130 and a thin film transistor array 140 and an organic light emitting array 150 are formed on the film substrate 1000 in this order and a protective layer 160 is formed to cover the organic light emitting array 150. A second anti-etching layer 210, a second buffer layer 220 and a touch electrode array 230 are disposed on the cover glass 3000. Here, the touch electrode array 230 is disposed to face the organic light emitting array 150. In this case, the protective layer 160 directly contacts the bottom of the adhesive layer 400 and the touch electrode array 230 directly contacts the top thereof.

An active region and a dead region are defined in the first buffer layer 130 and the second buffer layer 220, respectively, and the touch electrode array 230, the organic light emitting array 150 and thin film transistors present in the thin film transistor array 140 excluding a pad portion are formed in the active region. Also, the touch electrode pad portion 2350 and the pad portion of the thin film transistor array are defied in part regions of the dead region.

Here, the first anti-etching layer 120 and the second anti-etching layer 210 function to prevent damage to an internal array, in addition to the glass materials of first and second substrates during laser irradiation or etching. If desired, the first and second buffer layers 130 and 220 disposed thereunder are not damaged during removal of the first and second substrates, the first and/or second anti-etching layers 120 and 210 may be omitted.

Also, the first buffer layer 130 and the second buffer layer 220 may be formed by sequentially laminating the same type of inorganic film such as an oxide film ($SiO_2$) or nitride film (SiNx), or alternatively laminating different types of inorganic films. The first and second buffer layers 130 and 220 serve as barriers that prevent permeation of moisture or exterior air into the organic light emitting array 150 after the second substrate is joined to the first substrate.

Also, both the touch pad portion 2350 and the touch electrode array 230 are formed on the same surface of the second buffer layer 220.

The touch pad portion 2350 is connected to the pad portion of the thin film transistor array 140 via a sealant 450 including a conductive ball 455, when the upper and lower substrates are joined to each other via the adhesive layer 400. The adhesive layer 400 functions to prevent permeation of moisture and directly contacts the protective layer 160 that covers the organic light emitting array 150, thus preventing permeation of exterior air into the organic light emitting array 150 and more certainly prevents permeation of moisture, in addition to the functions of the protective layer 160.

Here, the thin film transistor array 140 including the pad portion has a side that protrudes from the touch electrode array 230. This configuration aims at providing, at the protrusion, an IC 500 that transfers a signal to simultaneously drive the touch electrode array and the thin film transistor array, and the organic light emitting array. Although not shown, the IC 500 is connected through lines (not shown) formed on the IC 500 and the first buffer layer 130 to driving pads and dummy pads of the thin film transistor array. Also, the IC 500 is bonded and connected to a flexible printed circuit board (FPCB, not shown) and may be controlled by a controller (not shown) provided in the FPCB. A dummy pad portion 155 including the dummy pads is formed in the same layer as a metal constituting a gate or data line in a region corresponding to the touch pad portion among the dead region disposed out of the active region. Each of dummy pads corresponds to each of the touch pads (Please refer to "2351b" in FIG. 5).

The touch pad portion 2350 is formed on the second buffer layer 220 and is formed at both edges of the side adjacent to a portion where the first buffer layer 130 protrudes more than the second buffer layer 220. Also, the touch pad portion 2350 formed at one edge is divided into a plurality of pad electrodes to enable voltage application or detection of first electrodes arrayed in an X-axis direction in the touch electrode array, and the touch pad portion 2350 formed at the other edge is divided into a plurality of pad electrodes to enable voltage application or detection of second electrodes arrayed in an Y-axis direction.

The conductive ball 455 connected to the touch pad portion 2350 is electrically connected to a dummy electrode (not shown) formed out of the thin film transistor array 140.

Here, during an actual process, the adhesive layer 400 and the sealant 450 are separately formed by application to different regions.

Meanwhile, the uppermost layer of the second buffer layer 220 that contacts the edge of the sealant 450 is formed of an inorganic film. This serves as a barrier which prevents deterioration in contact characteristics between the touch electrode and the dummy electrode caused by diffusion of exterior moisture or air via the sealant 450.

Meanwhile, as shown in FIG. 2, the organic light emitting display according to the present invention includes a film substrate 1000, a first anti-etching film 120 and a first buffer layer 130 formed in this order on the film substrate 1000, a thin film transistor array 140 having a thin film transistor in each pixel defined in a matrix form on the first buffer layer 130, an organic light emitting array 150 connected to the thin film transistor of each pixel, a protective layer 160 that covers the thin film transistor array 140 excluding the pad portion and the organic light emitting array 150, a touch electrode array 230 adhered to the protective layer via an adhesive layer 400 interposed between the protective layer 160 and the touch electrode array 230, and a second buffer layer 220 and a second anti-etching film 210 formed in this order on the touch electrode array 230, and includes a cover glass 3000 disposed on the second anti-etching film 210.

Here, the cover glass 3000 may be adhered to the second anti-etching film 210 via an adhesive layer interposed between the second anti-etching film 210 and the cover glass 3000, or may be disposed on the second anti-etching film 210 by a mechanical method or another method. The cover glass 3000 prevents damage to internal array from direct touch of a user and protects the internal array therefrom.

The organic light emitting display according to the present invention can be reduced in thickness by omitting a glass substrate having a thickness of about 0.7 mm, which is the thickest of components in the display, and can realize a bendable or flexible display using the film substrate 1000 as a plastic insulating film that functions to support the thin film transistor array 140, the organic light emitting array 150 and the touch electrode array 230.

In addition, in the process of forming arrays such as the thin film transistor array 140, the organic light emitting array 150 and the touch electrode array 230 on the film substrate, the film substrate is thermally expanded by heat applied to apparatuses for depositing or patterning the arrays, thus making normal processing impossible. In order to prevent this phenomenon, substantially, formation of arrays is carried out by forming anti-etching films 120 and 210 and buffer layers 130 and 220 under the thin film transistor array 140 and the touch electrode array 230, respectively, on the glass substrate, before formation of the thin film transistor array 140 and formation of the touch electrode array 230, and then loading the glass substrate in an apparatus for deposition or patterning.

Meanwhile, the thin film transistor array 140 includes a plurality of gate lines and a plurality of data lines that intersect each other to define pixels, and thin film transistors formed at the respective intersections between the gate lines and the data lines. A pad portion of the thin film transistor array 140 is obtained by forming a pad portion metal in the process of forming the gate and data lines.

Also, the organic light emitting array 150 includes a first electrode formed at least in the pixel, a second electrode formed in an upper layer spaced from the first electrode, and an organic light emitting layer formed between the first and second electrodes. Here, the first electrode may be connected to a drain electrode of the thin film transistor.

In addition, the first anti-etching film 120 and the second anti-etching film 210 may be for example formed of polyimide or photo-acryl.

The first and second anti-etching films 120 and 210 have a thickness of about 1 μm to about 20 μm.

Also, the first buffer layer 130 and the second buffer layer 220 function to prevent permeation of oxygen or moisture into organic films provided in the organic light emitting array and serve as barriers that prevent permeation of exterior air or moisture injected from a lower part.

The first buffer layer 130 and the second buffer layer 220 include a plurality of inorganic films. For example, the inorganic films may be formed by continuously or alternatively laminating $SiN_x$ or $SiO_2$. It can be seen from experimentation that, when two or more layers are laminated to a thickness of about 5,000 Å to 6500 Å as the first and second buffer layers 130 and 220, permeation of exterior air or moisture can be prevented. A total thickness of the first and second buffer layers 130 and 220 is 1 μm or less, which does not increase the thickness of the touchscreen-integrated display device.

Figure 4:
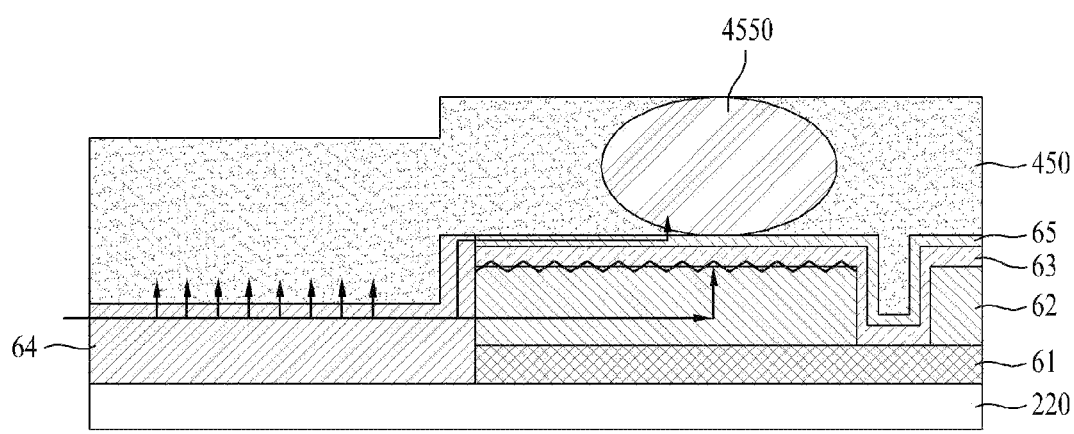
FIG. 4 is a sectional view illustrating permeation of moisture into an organic light emitting display pad portion of a reference embodiment.

Meanwhile, FIG. 4 is a sectional view illustrating permeation of moisture into an organic light emitting display pad portion of a reference embodiment.

That is, it can be seen from the reference embodiment shown in FIG. 4, when the second interlayer insulating film 64 that directly contacts the sealant 450 is formed of an organic insulating material such as photoacryl (PA), moisture or exterior air is diffused from the side of the exposed second interlayer insulating film 64 and may directly affect the conductive ball 4550, or the first interlayer insulating film 62 disposed between the metal layer 61, and transparent conductive layers 63 and 65 at the side of the touch pad. Accordingly, exterior moisture causes deterioration in contact characteristics between the touch pad and the conductive ball and may cause deterioration in internal characteristics of the touch electrode array in a structure having the first interlayer insulating film 62 or the second interlayer insulating film 64 connected to the active region.

The organic light emitting display according to the present invention is designed in consideration of these problems and in particular, prevents permeation of moisture into the edge of the sealant using a reliable material at a high temperature or a high humidity by forming an inorganic film as a component of the uppermost layer of the second buffer layer that directly contacts the edge of the sealant.

Hereinafter, a configuration of the touch electrode array will be described in detail.

Figure 5:
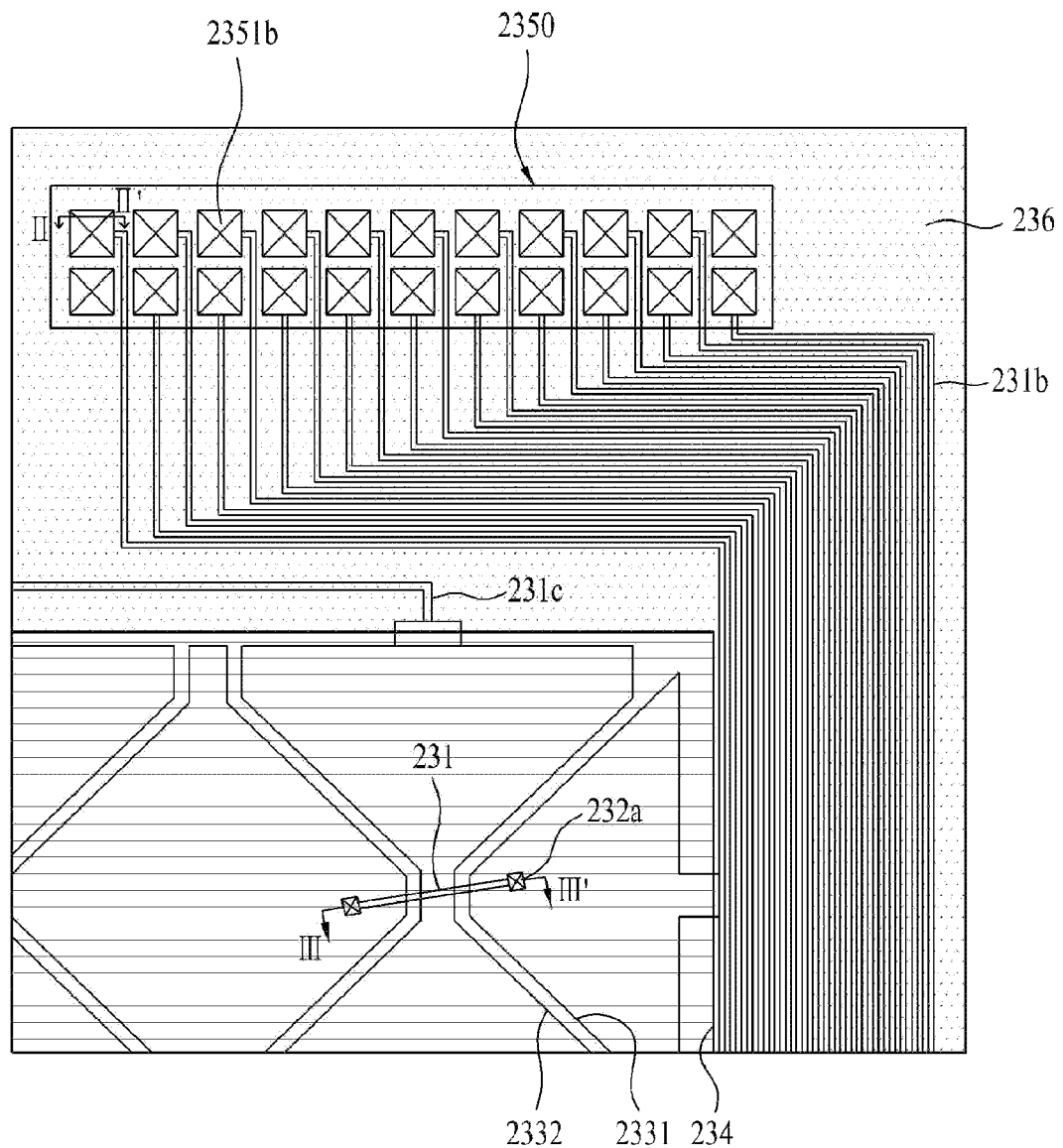
FIG. 5 is a plan view illustrating a first embodiment of the present invention.
Figure 6:
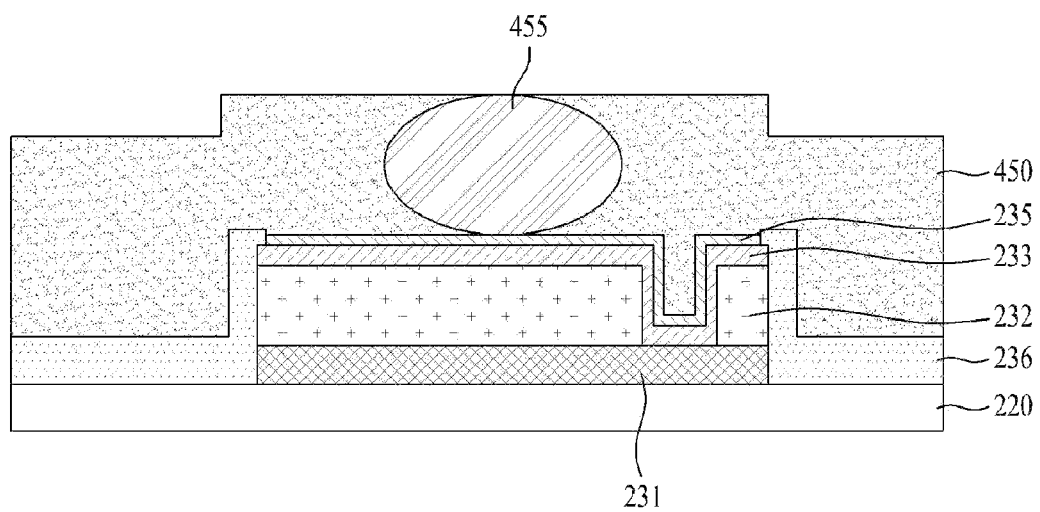
FIG. 6 is a sectional view taken along the line II-II' of FIG. 5.
Figure 7:
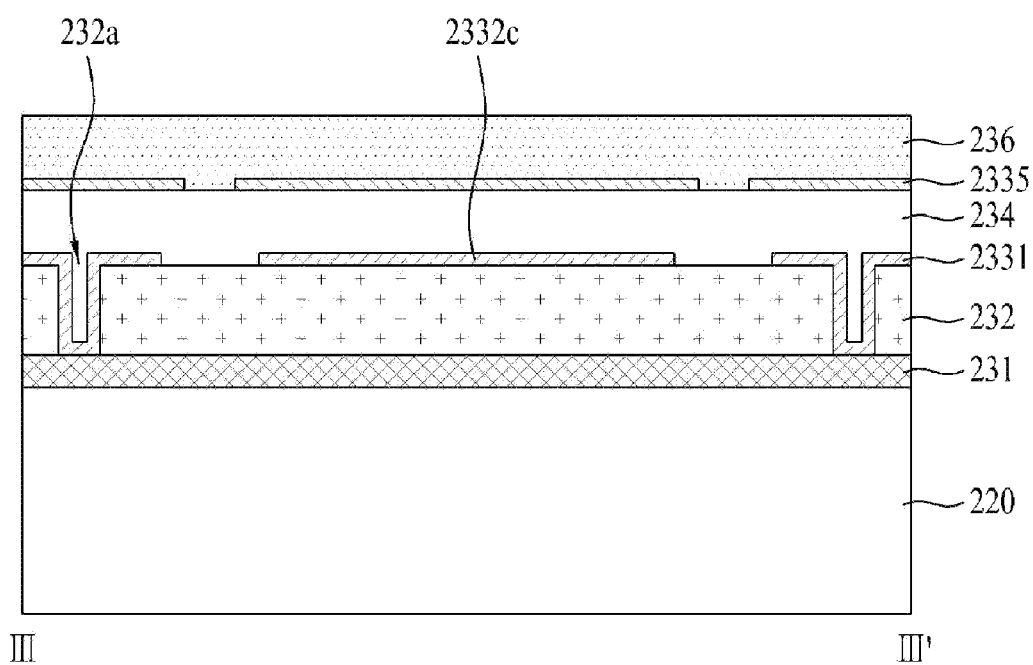
FIG. 7 is a sectional view taken along the line III-III' of FIG. 3.

FIG. 5 is a plan view illustrating a first embodiment of the present invention. FIG. 6 is a sectional view taken along the line II-II' of FIG. 5. FIG. 7 is a sectional view taken along the line III-III' of FIG. 3.

As shown in FIGS. 5 to 7, a structure of the second buffer layer 220 according to the first embodiment of the present invention will be described.

As shown in FIG. 5, the second buffer layer 220 includes an active region where a first electrode 2331 and a second electrode 2332 sensing touch intersect each other, and a dead region disposed out of the active region.

Here, a touch pad portion including a plurality of touch pads 2351b spaced from one another is defined in a part of the dead region of the second buffer layer 220. As shown in FIG. 2, the touch pad portion 2350 is disposed at both edges of the second buffer layer 220.

Also, in the dead region, the ends of the first electrode 2331 and the second electrode 2332 are connected through routing lines 231b and 231c to the touch pad 2351b.

When observing the cross-section of the touch pad and a surrounding area thereof from FIGS. 5 to 7, the touch pad includes a metal layer 231 disposed on the second buffer layer 220, a first interlayer insulating film 232 including a contact hole, a first transparent conductive film 233 that contacts the metal layer 231 via the contact hole on the first interlayer insulating film 232, a second interlayer insulating film 234 disposed on the first transparent conductive film 233, and a common electrode pattern 235 disposed on the second interlayer insulating film 234.

Also, a third interlayer insulating film 236 is formed to surround the top of the exposed second buffer layer 220 and the sidewall of the touch pad.

Here, the third interlayer insulating film 236 is formed of an inorganic material such as SiNx or SiOx and directly contacts the edge of the sealant 450 to prevent permeation of exterior air or moisture into the touch pad.

Here, the metal layer 231 is the same layer as the metal bridge 231 of the active region and the first transparent conductive film 233 is the same layer as first and second electrodes 2331 and 2332 that intersect each other in the active region. Meanwhile, not-described reference number "2332c" is present between the first electrodes 2331s spaced in a horizontal direction, as a connection pattern integrated with the second electrode 2332 disposed in a longitudinal direction. The metal bridge 231 connects spaced adjacent first electrodes 2331 across the second electrode connection pattern 2332c.

Meanwhile, the first interlayer insulating film 232 is formed between the metal layer 231 of the touch pad and the layer of the first transparent conductive film 233, as well as between the metal bridge 231 and layers excluding connection portions between first and second electrodes 2331, 2332 and 2332c.

In addition, the second interlayer insulating film 234 is disposed between the first electrode 2331 and the second electrode 2332, and the common electrode 2335. Here, the common electrode 2335 is a floating pattern not connected to the pad, which functions to shield driving of the thin film transistor array or the organic light emitting diode which faces the same.

In addition, the third interlayer insulating film 236 may be formed over the entire surface of the active region, and may be formed over the entire surface of regions provided between the touch pads and the remaining dead region.

Also, the conductive ball 455 present in the sealant 450 is connected to the second transparent conductive film 235 which is disposed at the top of the first and second transparent conductive films 233 and 235 that are consecutively connected to each other and contact each other.

Here, the common electrode 2335 and the second transparent conductive film 235 may be omitted. In this case, the second interlayer insulating film 234 serves as an inorganic insulating film which is present between the touch pads and performs a function of preventing moisture permeation at the edge of the sealant 450.

Figure 8:
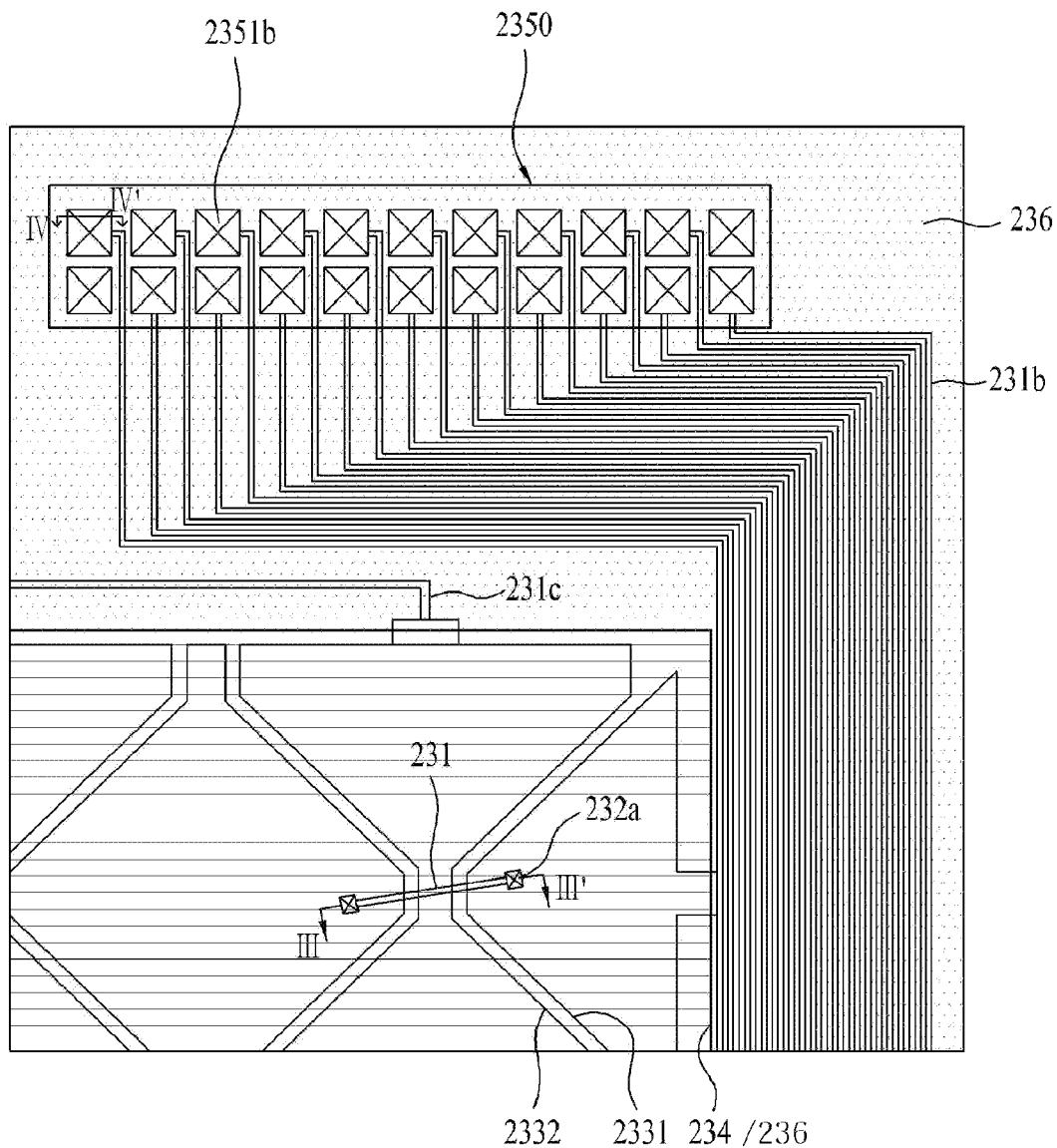
FIG. 8 is a plan view illustrating a second embodiment of the present invention.
Figure 9:
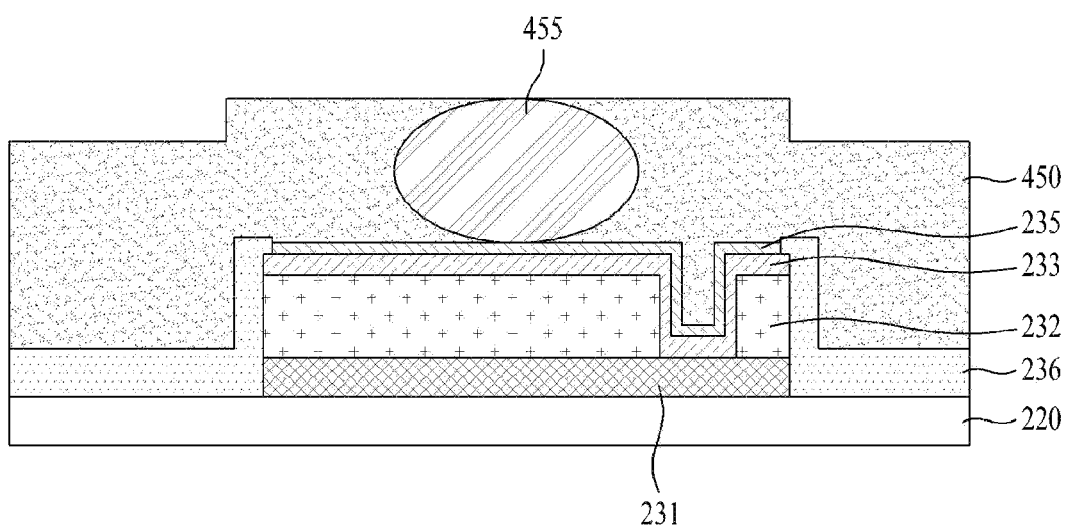
FIG. 9 is a sectional view taken along the line IV-IV' of FIG. 8.

FIG. 8 is a plan view illustrating a second embodiment of the present invention. FIG. 9 is a sectional view taken along the line IV-IV' of FIG. 8.

As shown in FIGS. 8 and 9, the second buffer layer of the organic light emitting display according to the second embodiment of the present invention has the same structure as that of the first embodiment in that the third interlayer insulating film is formed in the touch pad and the surroundings thereof (third interlayer insulating film is not formed in the active region).

In this case, since the edge of the sealant 450 directly contacts the third interlayer insulating film 236 formed of an inorganic film material, the inorganic film material capable of serving as a barrier against foreign matter such as moisture is present at the edge of the sealant 45 and contact characteristics of the touch pad can thus be stably maintained even after environmental reliability testing which is performed by exposing the touch pad for a long period of time under conditions of high temperature and high humidity, or high temperature.

The following embodiments suggest structures that are resistant to moisture and exterior air without adding a separate mask.

Figure 10:
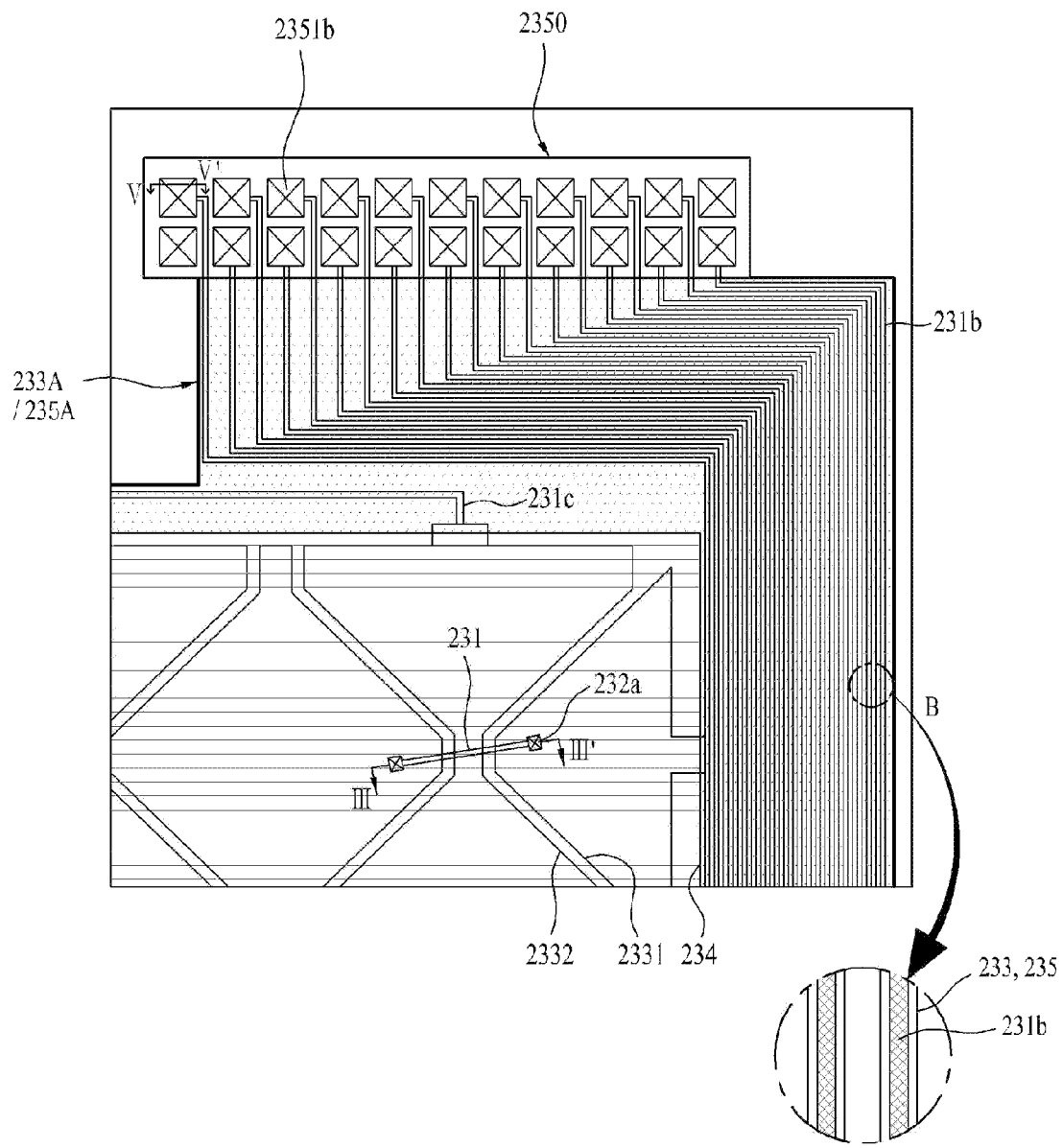
FIG. 10 is a plan view illustrating a third embodiment of the present invention.
Figure 11:
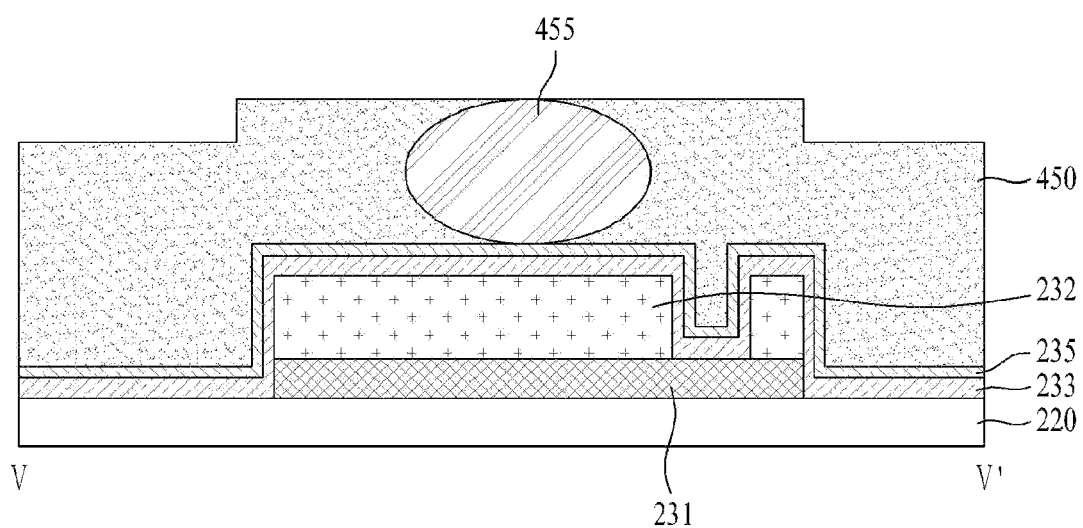
FIG. 11 is a sectional view taken along the line V-V' of FIG. 10.

FIG. 10 is a plan view illustrating a third embodiment of the present invention. FIG. 11 is a sectional view taken along the line V-V' of FIG. 10.

As shown in FIGS. 10 and 11, in the third embodiment of the present invention, the upper layers of the touch pad correspond to transparent conductive films 233 and 235 and the uppermost layers of the second buffer layer 220 that contact the edge of the sealant 450 correspond to the transparent conductive films 233 and 235. In this case, a plurality of touch pads 2351b in the touch pad portion 2350 are isolated through spaced transparent conductive films 233 and 235, the transparent conductive films 233A and 235A are formed in the dead region disposed outside of the touch pad portion 2350, and the surface that contacts the sealant 450 and the surface of the exposed dead region correspond to transparent conductive films in regions excluding the touch pads, thus preventing effects of moisture and exterior air on the interlayer insulating film of the touch pad.

Here, the routing line 231b is covered with the transparent conductive film 233 and 235. As a result, the transparent conductive films 233 and 235 prevent oxidization of the routing lines 231b. Here, the widths of transparent conductive films 233 and 235 are greater than those of the routing lines 231b and the transparent conductive films 233 and 235 are formed in the respective routing lines 231b and 231c to prevent short-circuit.

In such a structure, the uppermost layer of the second buffer layer 220 corresponds to the second transparent conductive film 235, thus enabling formation of this structure without adding any mask.

Also, in this case, since the sidewall of the interlayer insulating film interposed between the touch pads is covered with the transparent conductive films 233 and 235, the sealant 450 does not directly contact the interlayer insulating film made of an organic insulating material and there is thus no limitation of materials for the interlayer insulating films 232 and 234. That is, the material for the interlayer insulating film is not limited to an inorganic insulating material having a low dielectric constant, transparent conductive films 233 and 235 can prevent permeation of exterior air or moisture, although photoacryl vulnerable to moisture or a material having low transparency is used.

Other configurations of touch pads are the same as the first embodiment and a detailed description thereof is thus omitted.

Figure 12:
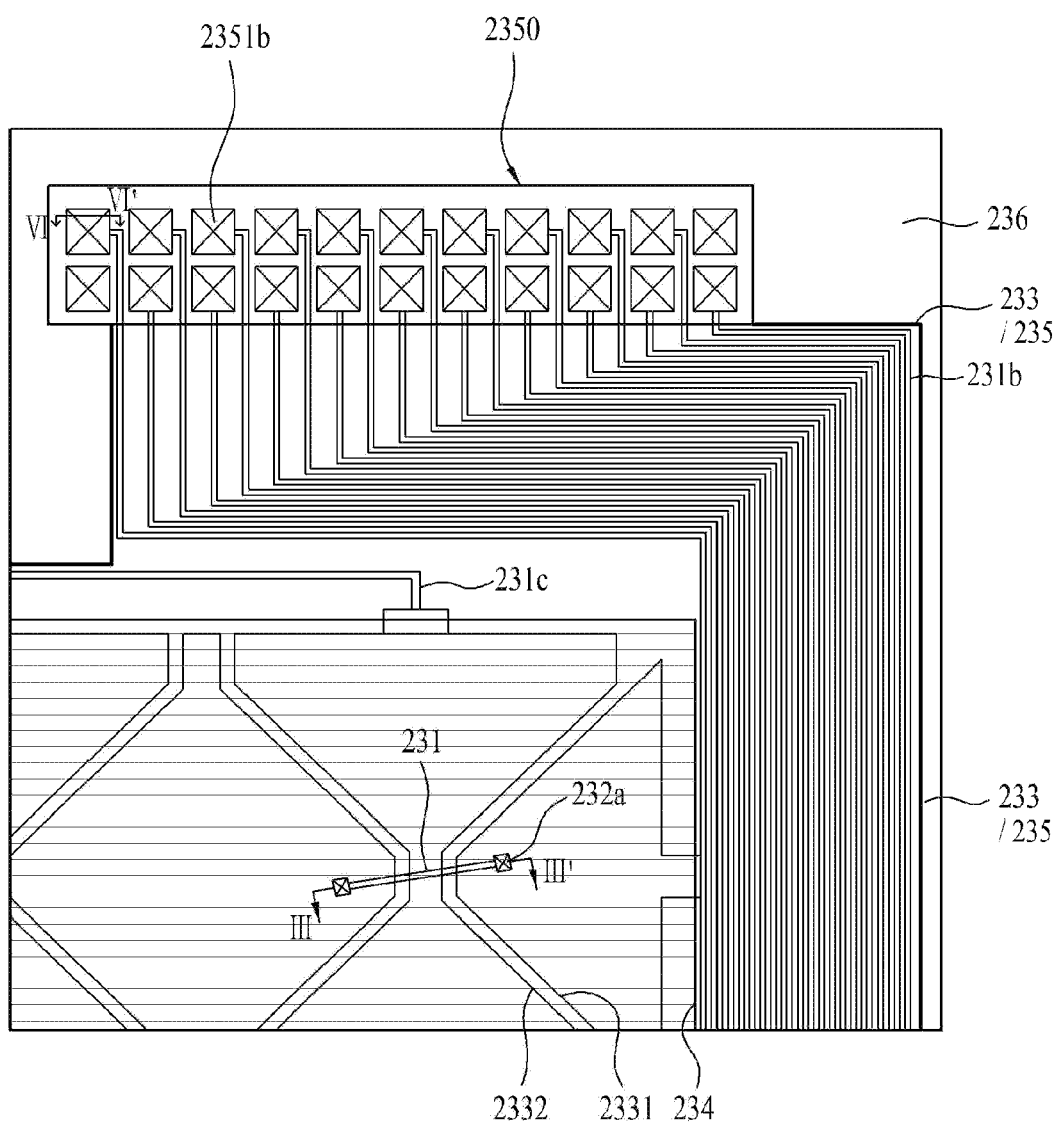
FIG. 12 is a plan view illustrating a fourth embodiment of the present invention.
Figure 13:
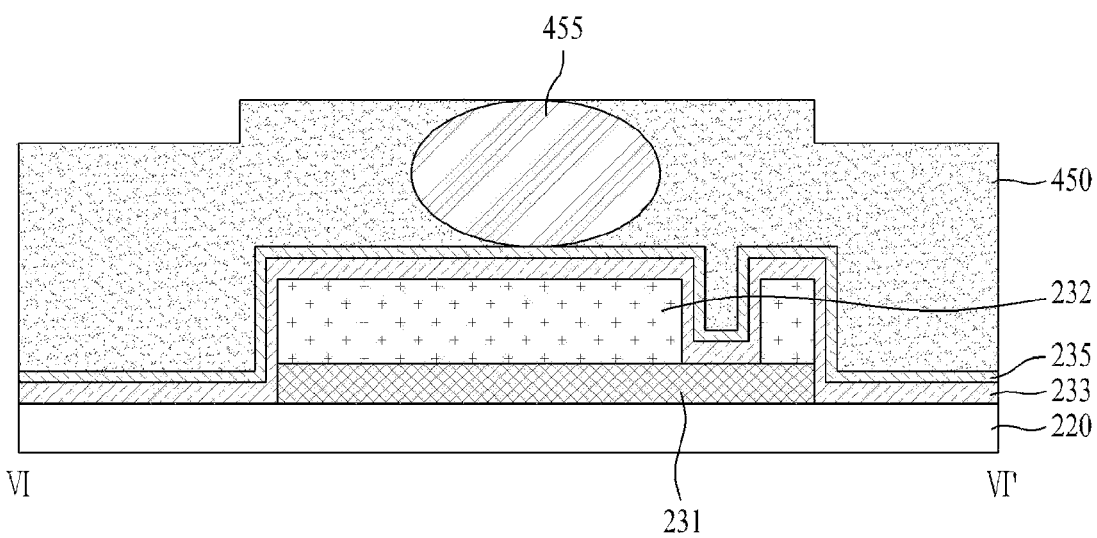
FIG. 13 is a sectional view taken along the line VI-VI' of FIG. 12.

FIG. 12 is a plan view illustrating a fourth embodiment of the present invention. FIG. 13 is a sectional view taken along the line VI-VI' of FIG. 12.

As shown in FIGS. 12 and 13, in the fourth embodiment of the present invention, the transparent conductive film is left only in the touch pad portion and the routing line portion, and the second buffer layer 220 is exposed in the remaining dead region.

In this case, configurations of the routing line portion and the touch pad are the same as described in those of the third embodiment and a detailed description thereof is thus omitted.

Figure 14:
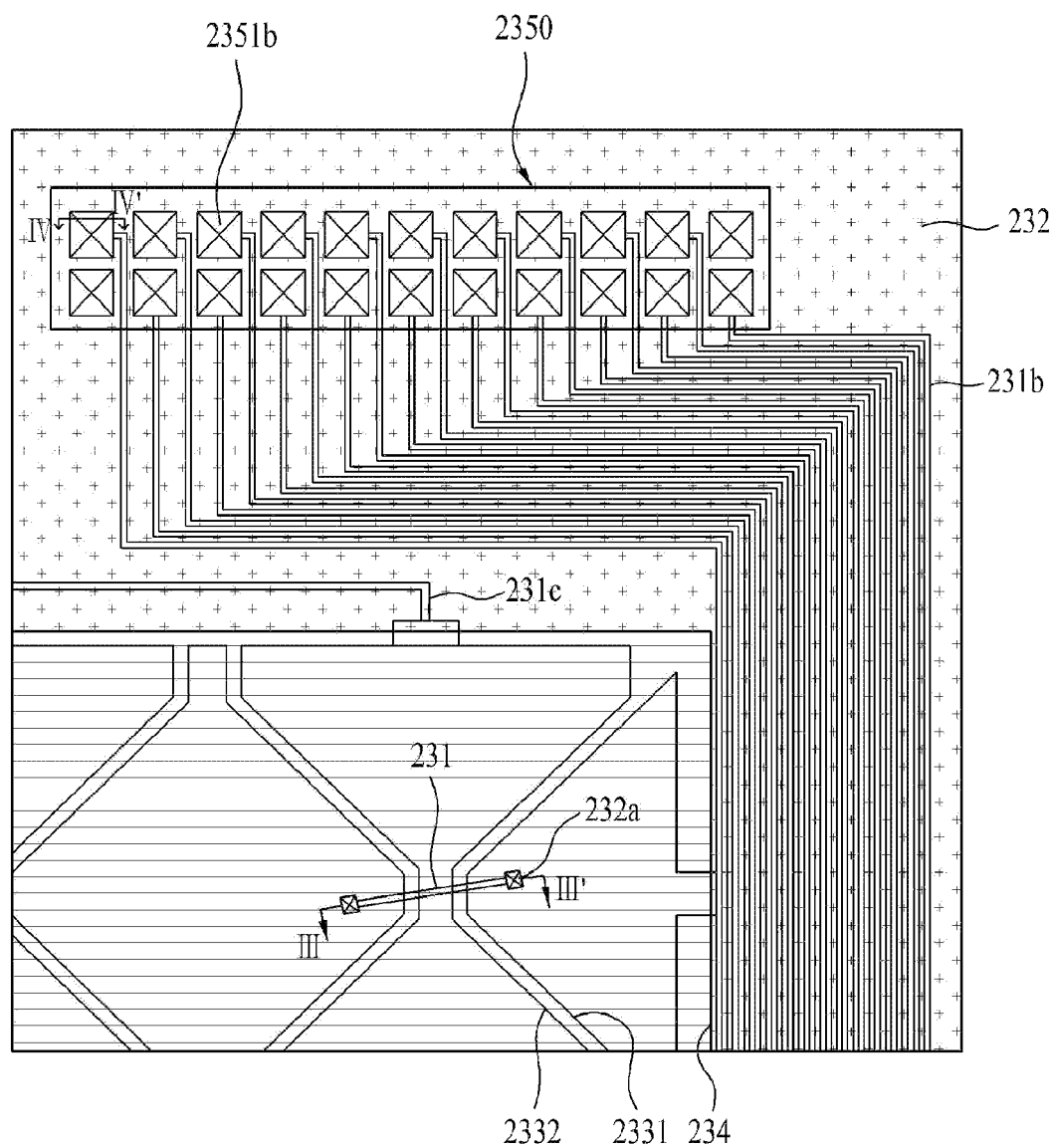
FIG. 14 is a plan view illustrating a fifth embodiment of the present invention.
Figure 15:
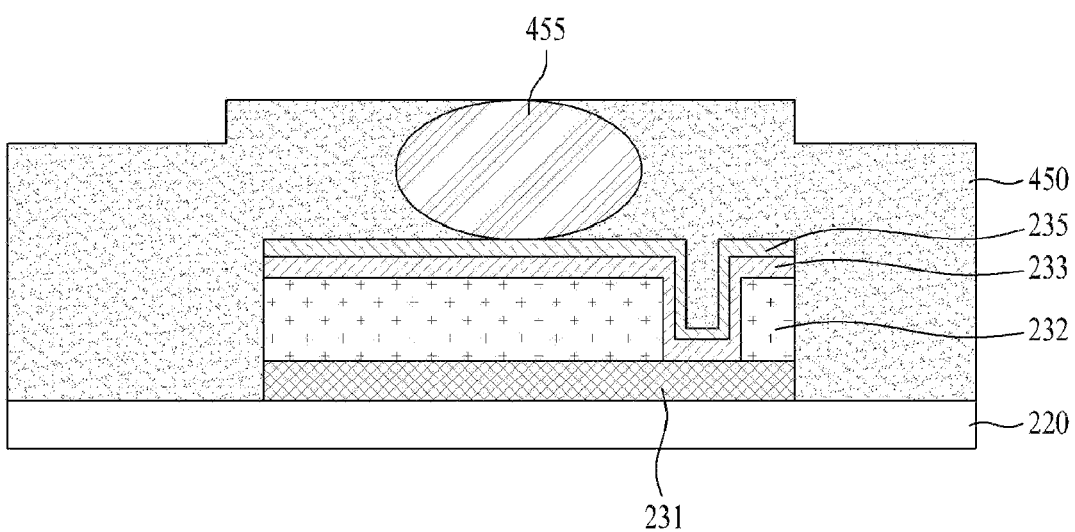
FIG. 15 is a sectional view taken along the line VII-VII' of FIG. 14.

FIG. 14 is a plan view illustrating a fifth embodiment of the present invention. FIG. 15 is a sectional view taken along the line VII-VII' of FIG. 14.

As shown in FIGS. 14 and 15, in the fifth embodiment of the present invention, polyimide (PI) or an inorganic insulating film material such as SiNx or SiOx that has low transparency, but is resistant to moisture is used as a material for the first interlayer insulating film 232 between the metal layer 231 and the first transparent conductive layer 233. Also, the insulating film or transparent conductive film is removed between the touch pads 2351b in the touch pad portion 2350. In this case, although the inorganic insulating film or polyimide component remains, the first interlayer insulating film 232 made of a material resistant to moisture and exterior air remains only on the sidewall of the sealant, thus enabling realization of a reliable structure.

In this case, the first and second interlayer insulating films 232 and 234 remain in both the dead region excluding the touch pad portion and the routing line portion and the material for the first interlayer insulating film 232 is the same as that of the touch pad portion and the second interlayer insulating film 234 may be arbitrarily determined.

If desired, the first and second interlayer insulating films 232 and 234 may remain in the dead region excluding the touch pad.

The following environmental reliability testing is performed for the configurations of the first to fifth embodiments and the comparative embodiment shown in FIG. 4.

First, under conditions of high temperature and high humidity, the reference embodiment of FIG. 4 has a defect percentage, defined by a ratio of the number of normal channels before testing to the number of abnormal channels after testing, of about 53% to about 96%, and a mean defect percentage of about 75%.

In addition, under conditions of high temperature, the reference embodiment of FIG. 4 has a defect percentage, defined by a ratio of the number of normal channels before testing to the number of abnormal channels after testing, of about 16% to about 62%, and a mean defect percentage of about 33.8%.

In other testing, upon exposure to heat shock, the reference embodiment of FIG. 4 has a defect percentage, defined by a ratio of the number of normal channels before testing to the number of abnormal channels after testing, of about 42% to about 81%, and a mean defect percentage of about 57.4%.

On the other hand, under high-temperature testing based on the first embodiment of the present invention, the reference embodiment of FIG. 4 has a defect percentage, defined by a ratio of the number of normal channels before testing to the number of abnormal channels after testing, of about 0% to about 5%, and a mean defect percentage of about 3%.

In addition, under conditions of high temperature and high humidity, the first to third embodiments have a defect percentage, defined by a ratio of the number of normal channels before testing to the number of abnormal channels after testing, of about 5% or less, and a mean defect percentage of about 3% or less.

That is, the organic light emitting display according to the present invention uses an inorganic film as a material for the edge of the sealant, thus preventing permeation of exterior moisture under conditions of high temperature and high humidity and maintaining contact characteristics of the touch pad, although the display is driven for a long period of time.

That is, the organic light emitting display according to the present invention can improve contact characteristics between the touch pad of the second buffer layer and the dummy pad portion of the first buffer layer and can maintain good contact characteristics even under stress conditions such as environmental reliability testing.

For this purpose, a material for the interlayer insulating film formed on the second buffer layer is not limited to an organic insulating film having a predetermined thickness of 2 µm or more, an inorganic insulating film or an inorganic film such as a transparent conductive film is left in the dead region and between touch pad portions, in order to prevent effects of moisture and exterior air. That is, although an organic insulating film is maintained as the lower insulating film of the touch pad, a structure capable of preventing permeation of exterior moisture can be designed by using an inorganic film as a material that directly contacts exterior air at the edge of the sealant. Since one of the interlayer insulating films may be used as the inorganic film, it may be applied to the structure of the present invention with improved environmental reliability without increasing the number of masks.

As apparent from the fore-going, the organic light emitting display according to the present invention has the following advantages.

First, the organic light emitting display including an in-cell touch electrode array has a structure in which a touch electrode pattern and a touch pad driving the same are formed inside of a cover glass. Accordingly, flexible printed circuit bonding (FPCB) to connect the touch pad to the thin film transistor array and the pad portion of the organic light emitting array that face the touch pad is performed. In this case, contact between the touch pad, and the thin film transistor array and the pad of the organic light emitting array that face the touch pad is carried out using a sealant including a conductive ball. According to the present invention, the uppermost layer of the second buffer layer including the touch electrode array that contacts the edge of the sealant is maintained as an inorganic film, and contact characteristics can be efficiently maintained after environmental reliability testing in which resistance to specific conditions of high temperature and high humidity is performed.

Second, such an inorganic film is formed using an interlayer insulating film and a transparent conductive film used for formation of the touch electrode without adding any process, thus enabling formation of a structure with an improved reliability without adding a mask.

Third, the uppermost layer at the edge of the sealant, as well as the sidewall between touch pads are covered with an inorganic film, thus preventing exposure of a protective film vulnerable to moisture and high temperature and optimizing improvement in reliability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
    a first buffer layer and a second buffer layer facing each other, respectively, having an active region and a dead region;
    a transistor-organic light emitting diode array in the active region of the first buffer layer;
    a touch electrode array in the active layer of the second buffer layer;
    a touch pad portion in a part of the dead region of the second buffer layer;
    a plurality of touch pads spaced from one another in the touch pad portion;
    a dummy pad portion in the dead region of the first buffer layer, the dummy pad portion comprising a plurality of dummy pads corresponding to the touch pads, respectively;
    a sealant comprising a plurality of conductive balls between the touch pad portion and the dummy pad portion; and
    a barrier layer on the second buffer layer, contacting the sealant among the touch pads and the second buffer layer adjacent to the touch pad portion at the dead region, the barrier layer comprising an inorganic layer.

2. The organic light emitting display according to claim 1, wherein each touch pad comprises a metal layer on the second buffer layer, a transparent conductive pattern and an interlayer insulating film interposed between the metal layer and the transparent conductive pattern to bring the metal layer into contact with the transparent conductive pattern.

3. The organic light emitting display according to claim 2, wherein the barrier layer comprises SiNx or SiOx.

4. The organic light emitting display according to claim 3, wherein a sidewall of each touch pad is covered with SiNx or SiOx.

5. The organic light emitting display according to claim 2, wherein the barrier layer comprises a transparent conductive film.

6. The organic light emitting display according to claim 5, wherein the transparent conductive film covers a sidewall of the interlayer insulating film.

7. The organic light emitting display according to claim 5, wherein the transparent conductive pattern of the touch pad is the same layer as the transparent conductive film.

8. The organic light emitting display according to claim 7, wherein the transparent conductive pattern is spaced and separated between the touch pads.

9. The organic light emitting display according to claim 2, wherein the barrier layer is the interlayer insulating film.

10. The organic light emitting display according to claim 9, wherein the interlayer insulating film comprises at least one of SiNx, SiOx and polyimide.

11. The organic light emitting display according to claim 2, wherein the interlayer insulating film of the touch pad comprises an organic insulating film.

12. The organic light emitting display according to claim 2, wherein the transparent conductive pattern comprises a first layer and a second layer, being a transparent conductive film material.

13. The organic light emitting display according to claim 12, wherein the first layer is the same layer as a first electrode and a second electrode that constitute the touch electrode array and cross each other and the second layer is the same layer as a common electrode pattern that covers the first and second electrodes.

* * * * *